(12) United States Patent
Tsao et al.

(10) Patent No.: US 12,106,809 B2
(45) Date of Patent: *Oct. 1, 2024

(54) SYSTEM AND METHOD FOR RELIABLE SENSING OF MEMORY CELLS

(71) Applicant: Taiwan Semiconductor Manufacturing Company, Ltd., Hsinchu (TW)

(72) Inventors: Szu-Chun Tsao, Hsinchu (TW); Jaw-Juinn Horng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/362,201

(22) Filed: Jul. 31, 2023

(65) Prior Publication Data

US 2023/0377661 A1    Nov. 23, 2023

Related U.S. Application Data

(63) Continuation of application No. 17/195,990, filed on Mar. 9, 2021, now Pat. No. 11,763,891.

(60) Provisional application No. 63/031,145, filed on May 28, 2020.

(51) Int. Cl.
*G11C 16/24* (2006.01)
*G11C 16/26* (2006.01)

(52) U.S. Cl.
CPC ............. *G11C 16/24* (2013.01); *G11C 16/26* (2013.01)

(58) Field of Classification Search
CPC ........................................ G11C 16/24

USPC .................................................. 365/185.21
See application file for complete search history.

(56) References Cited

U.S. PATENT DOCUMENTS

| 5,200,924 A | 4/1993 | Wong | |
|---|---|---|---|
| 6,525,969 B1 * | 2/2003 | Kurihara | G11C 16/0491 365/185.16 |
| 6,587,367 B1 * | 7/2003 | Nishimura | G11C 11/22 365/210.11 |
| 7,397,696 B1 * | 7/2008 | Wadhwa | G11C 16/24 365/189.11 |
| 10,510,383 B2 * | 12/2019 | Tseng | G11C 16/3459 |

(Continued)

FOREIGN PATENT DOCUMENTS

| CN | 111028872 A | 4/2020 |
|---|---|---|
| JP | 2005-063633 A | 3/2005 |

(Continued)

OTHER PUBLICATIONS

Office Action issued in connection with Korean Appl. No. 10-2024-0031868 dated Mar. 28, 2024.

*Primary Examiner* — Muna A Techane
(74) *Attorney, Agent, or Firm* — FOLEY & LARDNER LLP (57) ABSTRACT

Disclosed herein are related to a memory system including a memory cell and a circuit to operate the memory cell. In one aspect, the circuit includes a pair of transistors to electrically couple, to the bit line, a selected one of i) a voltage source to supply a reference voltage to the memory cell or ii) a sensor to sense a current through the memory cell. In one aspect, the circuit includes a first transistor. The first transistor and the bit line may be electrically coupled between the pair of transistors and the memory cell in series.

20 Claims, 10 Drawing Sheets

(56) References Cited

U.S. PATENT DOCUMENTS

| | | | |
|---|---|---|---|
| 11,763,891 B2* | 9/2023 | Tsao | G11C 13/0026 365/185.21 |
| 2007/0041244 A1* | 2/2007 | Chih | G11C 16/3427 365/185.1 |
| 2007/0189101 A1* | 8/2007 | Lambrache | G11C 11/413 365/230.05 |
| 2008/0291763 A1 | 11/2008 | Mori et al. | |
| 2012/0243326 A1 | 9/2012 | Maeda | |
| 2012/0327717 A1* | 12/2012 | Fastow | G11C 5/063 257/E27.06 |
| 2013/0083615 A1* | 4/2013 | Choi | G11C 11/4091 365/203 |
| 2013/0322154 A1 | 12/2013 | Youn | |
| 2018/0330777 A1 | 11/2018 | Agarwal et al. | |
| 2018/0358057 A1* | 12/2018 | Chang | G11C 7/12 |
| 2019/0103145 A1 | 4/2019 | Tseng | |
| 2020/0160901 A1 | 5/2020 | Boujamaa et al. | |

FOREIGN PATENT DOCUMENTS

| | | |
|---|---|---|
| KR | 1020130055992 A | 5/2013 |
| TW | I630607 B | 7/2018 |

* cited by examiner

FIG. 10

SYSTEM AND METHOD FOR RELIABLE SENSING OF MEMORY CELLS

CROSS-REFERENCE TO RELATED APPLICATION

This application is a continuation of U.S. patent application Ser. No. 17/195,990, filed Mar. 9, 2021, which claims the benefit of and priority to U.S. Provisional Application No. 63/031,145, filed May 28, 2020, each of which are incorporated herein by reference in their entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes a memory cell and a memory controller to operate the memory cell. In one aspect, the memory controller includes a pair of transistors to electrically couple, to the bit line, a selected one of i) a voltage source to bias the memory cell or ii) a sensor to sense a current through the memory cell. In one aspect, the memory controller includes a first transistor, where the first transistor and the bit line are connected between the pair of transistors and the memory cell in series. In one aspect, the pair of transistors includes a second transistor connected between the voltage source and the memory cell, and a third transistor connected between the sensor and the memory cell.

In one aspect, the memory controller generates various pulses to configure the memory cell. For example, the memory controller generates a first pulse and applies the first pulse to a word line of a memory cell. The memory controller may also generate a set of second pulses and apply the set of second pulses to the second transistor of the pair of transistors. The memory controller may generate a set of third pulses and apply the set of third pulses to the third transistor of the pair of transistors. In one aspect, one of the set of second pulses has a first state during a first duration (or a set time period) after a first time, at which an edge (e.g., rising edge) of the first pulse occurs, to electrically couple the voltage source to the bit line. During the first duration (or the set time period), one of the set of third pulses has a second state to electrically decouple the sensor from the bit line. After the first duration, the set of second pulses and the set of third pulses may have opposite phases during a second duration, such that the pair of transistors can be switched or toggled differentially.

Advantageously, the disclosed memory system can perform high speed operations on one or more memory cells with improved accuracy. In one aspect, writing data at memory cells or reading data from the memory cells includes applying various high-speed pulses (e.g., over 1 GHz) to the memory cells. For example, a pulse may be applied to a word line (or a gate line) connected to a memory cell. However, due to parasitic capacitances among a word line and other gate lines, the first pulse applied to the word line may affect a voltage or current at other gate lines.

Change in voltage or current at other gate lines due to parasitic capacitances may cause inaccuracy in reading data stored by a memory cell. In one approach, in response to an edge (e.g., rising edge) of the first pulse applied to the word line, the disclosed memory system may electrically couple the bit line to the voltage source while electrically decoupling the bit line from the sensor for the first duration (or a set time period) to allow voltages or currents at other gate lines to settle. After the first duration (or the set time period), the disclosed memory system may electrically decouple the bit line from the voltage source while electrically coupling the bit line to the sensor to sense or read data stored by the memory cell. By reading data stored by the memory cell after the voltages or currents at other gate lines settle, data stored by the memory cell can be read in a reliable manner with reduced effects due to parasitic capacitances.

In one aspect, an edge (e.g., falling edge) of the first pulse applied to the word line is aligned with an edge (e.g., rising edge) of another one of the set of second pulses and an edge (e.g., falling edge) of another one of the set of third pulses. In one aspect, in response to the edge (e.g., falling edge) of the first pulse, the memory cell may be disabled. By aligning the edge (e.g., falling edge) of the first pulse with the edge (e.g., rising edge) of the another one of the set of second pulses and the edge (e.g., falling edge) of the another one of the set of third pulses, the pair of transistors may electrically couple the voltage source to the bit line and electrically decouple the memory cell from the bit line when the memory cell is disabled, such that a fluctuation or variation in a voltage at the bit line can be reduced.

Figure 1:
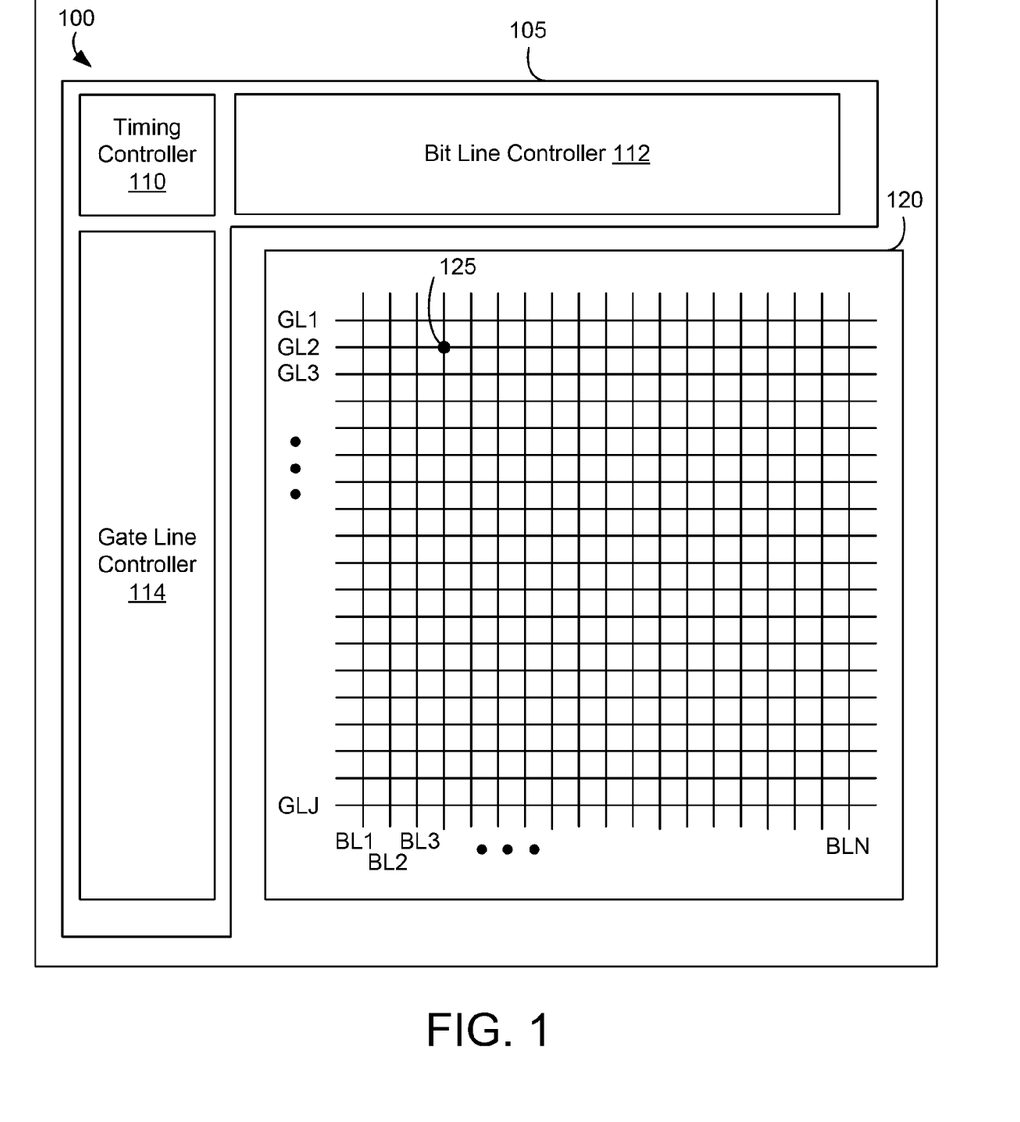
FIG. 1 is a diagram of a memory system, in accordance with one embodiment.

FIG. 1 is a diagram of a memory system 100, in accordance with one embodiment. In some embodiments, the memory system 100 is implemented as an integrated circuit. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction (e.g., X-direction) and bit lines BL0, BL1 . . . BLN, each extending in a second direction (e.g., Y-direction). The gate lines GL and the bit lines BL may be conductive metals or conductive rails. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 includes a flash memory cell with at least two gate electrodes. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120, and the bit line controller 112 is a circuit that provides or senses a voltage or current through one or more bit lines BL of the memory array 120. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 provides a voltage or a current to the memory cell 125 through a gate line GL connected to the memory cell 125, and the bit line controller 112 senses a voltage or a current corresponding to data stored by the memory cell 125 through a bit line BL connected to the memory cell 125. In some embodiments, the memory controller 105 includes more, fewer, or different components than shown in FIG. 1.

Figure 2:
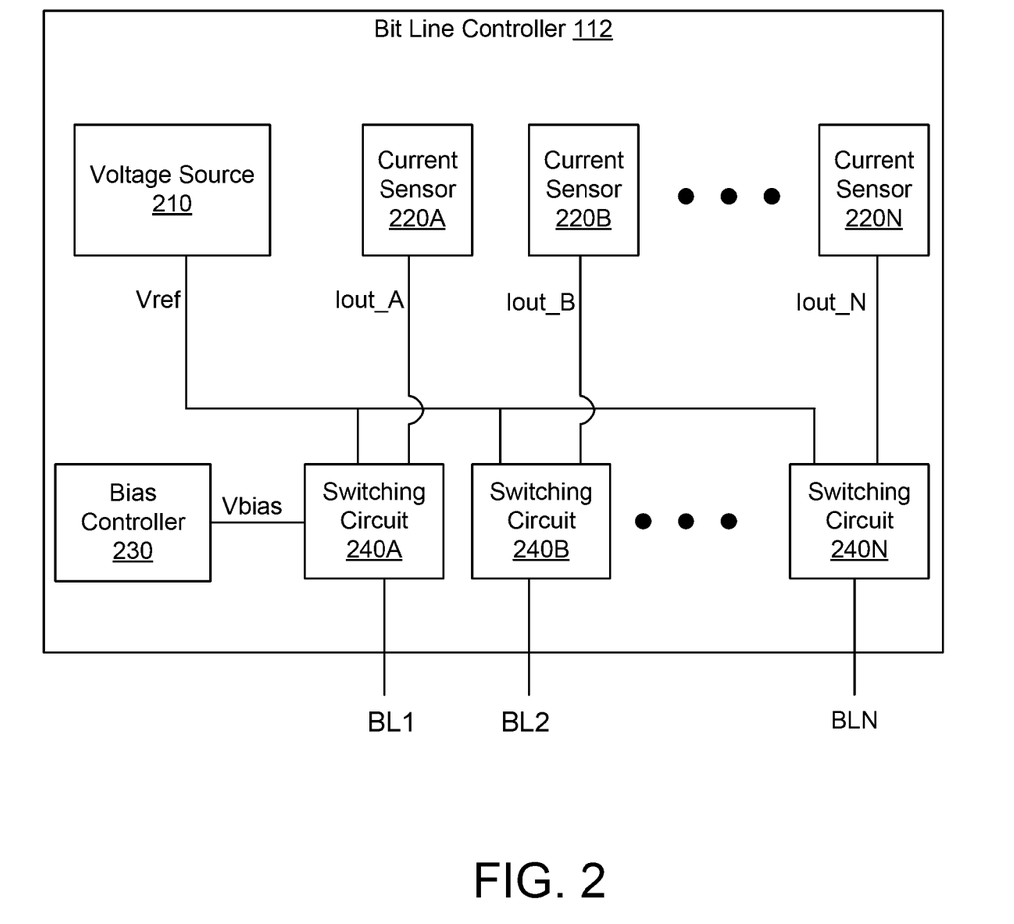
FIG. 2 is a bit line controller, in accordance with one embodiment.

FIG. 2 is a diagram of the bit line controller 112 of FIG. 1, in accordance with one embodiment. In some embodiments, the bit line controller 112 includes a voltage source 210, current sensors 220A, 220B . . . 220N, a bias controller 230, and switching circuits 240A, 240B . . . 240N. These components may operate together to apply a voltage or current to the memory cell 125, and sense current Iout through one or more memory cells 125 to read data stored by the memory cell 125. In some embodiments, the bit line controller 112 includes more, fewer, or different components than shown in FIG. 2.

In one aspect, the voltage source 210 is a component that provides a reference voltage Vref to the switching circuits 240A, 240B . . . 240N. In some embodiments, the voltage source 210 is replaced by other components that perform the similar functionalities of the voltage source 210 described herein. In one configuration, the voltage source 210 is connected to the switching circuits 240A, 240B . . . 240N through conductive traces or metal rails. In this configuration, the voltage source 210 may generate a reference voltage Vref and provide the reference voltage Vref to the switching circuits 240A, 240B . . . 240N. The reference voltage Vref may be a supply voltage VDD or any voltage to supply to the bit line BL. In some embodiments, the voltage source 210 is implemented as a separate component from the bit line controller 112.

In one aspect, each current sensor 220 is a component that senses current Iout from or through a corresponding switching circuit 240. In some embodiments, the current sensor 220 is replaced by other components that perform the similar functionalities of the current sensor 220 described herein. In one configuration, each of the current sensors 220A . . . 220N is connected to a corresponding one of the switching circuits 240A, 240B . . . 240N through conductive traces or metal rails. In this configuration, each current sensor 220 may sense current Iout through the corresponding switching circuit 240. In some embodiments, the current sensor 220 includes a capacitor connected to the switching circuit 240 and a sense amplifier connected to the capacitor. In one approach, the current sensor 220 may charge the capacitor, such that the capacitor has an initial voltage. According to the current Tout through the switching circuit 240, the capacitor may discharge, such that the voltage at the capacitor may decrease from the initial voltage. The sense amplifier may detect or sense the voltage at the capacitor corresponding to the current Tout through the switching circuit to determine the data stored by the memory cells. In some embodiments, the current sensors 220A . . . 220N are implemented as separate components from the bit line controller 112.

In one aspect, the switching circuit 240 is a component that selectively couples the voltage source 210 or the current sensor 220 to a bit line BL. The switching circuit 240 may be embodied as a pair of transistors. Each transistor may be metal oxide semiconductor field effect transistor (MOSFET), FinFET, gate all around FET (GAAFET), or any transistor. In one configuration, the switching circuit 240 includes a first port connected to the voltage source 210, a second port connected to the current sensor 220, and a third port connected to a corresponding bit line BL. The switching circuit 240 may also include a control port connected to the timing controller 110 to receive control signals or pulses from the timing controller 110. In this configuration, the switching circuit 240 may receive control signals or pulses from the timing controller 110, and electrically couple a selected one of the voltage source 210 or the current sensor 220 to the bit line BL, according to the control signals or pulses.

In one aspect, the bias controller 230 is a component that controls or biases voltages at the bit lines. The bias controller 230 may be embodied as a feedback circuit that senses a voltage at a bit line BL and generates a bias voltage VBias according to the sensed voltage at the bit line BL. The bias controller 230 may apply the bias voltage VBias to the switching circuit 240. In one aspect, the bias controller 230 may regulate the voltage at the bit line BL to be within predetermined range (e.g., ±50 mV) to allow stable operations of the memory cell 125.

Figure 3:
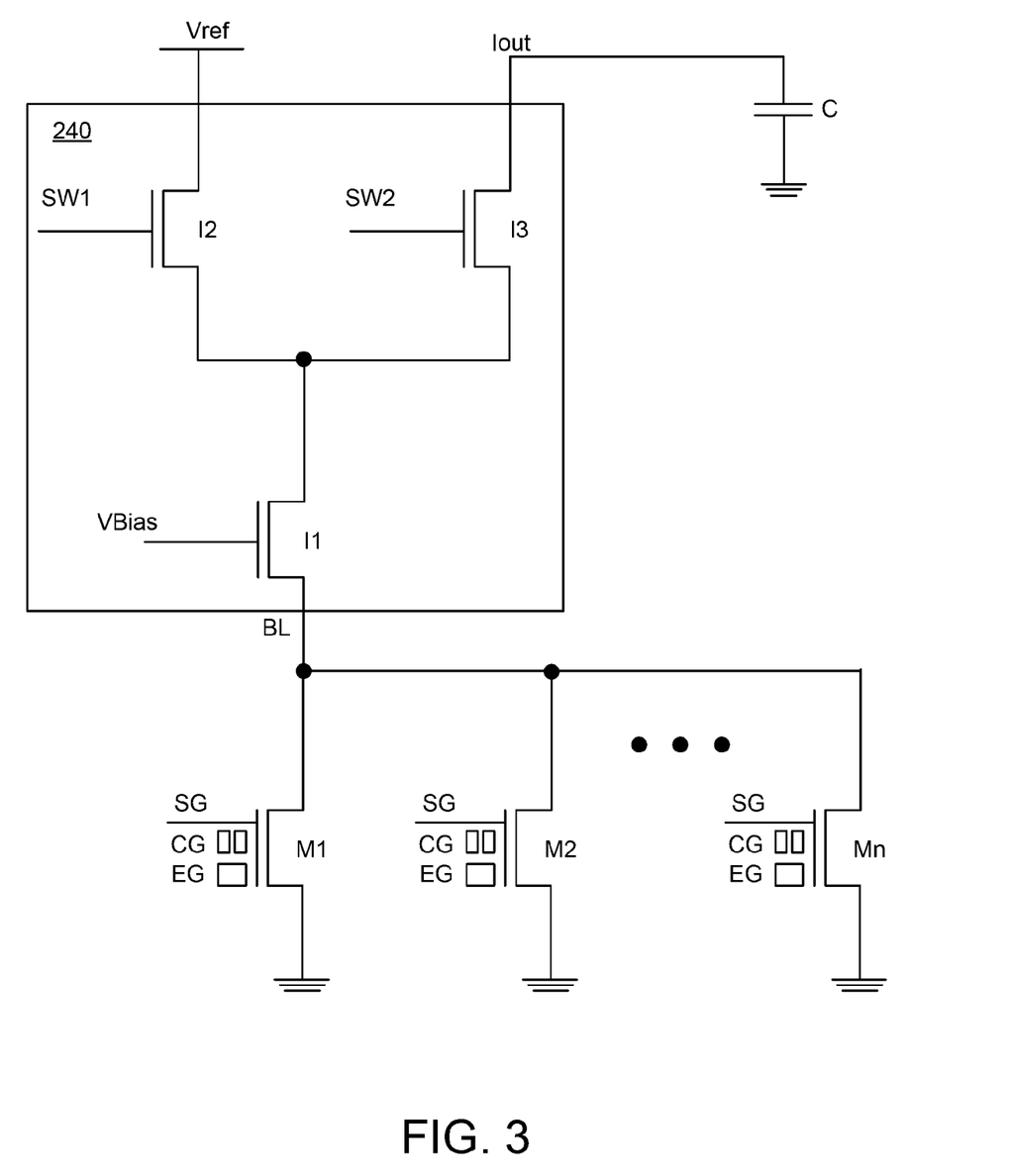
FIG. 3 is a diagram of a switching circuit and a set of memory cells connected to the switching circuit, in accordance with one embodiment.

FIG. 3 is a diagram of the switching circuit 240 and a set of memory cells M1, M2 . . . Mn, in accordance with one embodiment. In some embodiments, the switching circuit 240 includes a first transistor I1, and a pair of transistors I2, I3. In one aspect, the switching circuit 240 is configured to provide a reference voltage Vref to one or more of the set of memory cells M1, M2 . . . Mn through the a bit line BL or allow current Iout through one or more of the set of memory cells M1, M2 . . . Mn.

Each memory cell M may be the memory cell 125. The memory cell M may be a flash memory cell with at least two gate electrodes, a drain electrode connected to a bit line BL, and a source electrode connected to a power rail for providing a supply voltage (e.g., GND or VSS) or a select line. In one example, the memory cell M includes a split gate electrode SG, a control gate electrode CG, and an erase gate electrode EG connected to gate line controller 114. The split gate electrodes SG of different memory cells may be connected to the gate line controller 114 through corresponding word lines. To perform operations on the memory cell M, various voltages can be applied to the gate electrodes. In one aspect, operations on the memory cell M can be performed according to a voltage applied to the split gate electrode SG and a threshold voltage of the memory cell M, where the threshold voltage of the memory cell M may be determined according to a difference between a voltage at the control gate electrode CG and a voltage at the erase gate electrode EG of the memory cell M. For example, to store data, 1V, 8V and 4V can be applied to the gate electrodes SG, CG, EG, respectively. For example, to read data, 1.1V, 0.8V and 0V can be applied to the gate electrodes SG, CG, EG, respectively. For another example, to erase data, 0V, 0V and 8V can be applied to the gate electrodes SG, CG, EG, respectively.

In some embodiments, the switching circuit 240 includes the transistors I1, I2, I3 having a differential architecture. The transistors I1, I2, I3 may be embodied as MOSFET, FinFETs, GAAFETs, or any transistors. The transistors I1, I2, I3 may be N-type transistors. In one configuration, the first transistor I1 includes a source electrode connected to the bit line BL, a gate electrode connected to the bias controller 230, and a drain electrode connected to source electrodes of the transistors I2, I3. In one configuration, the second transistor I2 includes the source electrode connected to a drain electrode of the first transistor I1 and the source electrode of the third transistor I3. The second transistor I2 also includes a gate electrode connected to the timing controller 110, and a drain electrode connected to the voltage source 210 through a power rail. The third transistor I3 also includes a gate electrode connected to the timing controller 110, and a drain electrode connected to the current sensor 220 through a metal rail.

In this configuration, the switching circuit 240 provides the reference voltage Vref to the bit line BL or enables current Iout through the bit line BL. In some embodiments, the switching circuit 240 includes different components than shown in FIG. 3, or replaced by other components performing the functionality of the switching circuit 240 described herein. In one aspect, the first transistor I1 may receive a bias voltage VBias from the bias controller 230 at the gate electrode. The first transistor I1 may operate as a cascode transistor to improve resistance or impedance at the bit line BL, and improve stability of voltage or current at the bit line BL according to the bias voltage VBias. The second transistor I2 may receive a signal SW1 including one or more pulses from the timing controller 110 at the gate electrode and receive a reference voltage Vref from the voltage source 210 at the drain electrode. The third transistor I3 may receive a signal SW2 including one or more pulses from the timing controller 110 at the gate electrode. According to a high voltage (e.g., VDD) of the signal SW1, the transistor I2 may electrically couple the voltage source 210 to the drain electrode of the transistor I1 to provide the reference voltage Vref to the drain electrode of the transistor I1. According to a low voltage (e.g., GND) of the signal SW1, the transistor I2 may electrically decouple the voltage source 210 from the drain electrode of the transistor I1. According to a high voltage (e.g., VDD) of the signal SW2, the transistor I3 may electrically couple a capacitor C of the current sensor 220 to the drain electrode of the transistor I1. According to a low voltage (e.g., GND) of the signal SW2, the transistor I3 may electrically decouple the current sensor 220 from the drain electrode of the transistor I1. Hence, the switching circuit 240 may provide the reference voltage Vref to the bit line BL or enable current Iout through the set of memory cells M1, M2 . . . Mn to read data stored by the set of memory cells M1, M2 . . . Mn, according to the signals SW1, SW2.

In one aspect, the timing controller 110 can apply signals SW1, SW2 to the switching circuit 240 and the gate line controller 114 can apply word line control signals WL to respective split gate electrodes of the memory cells M1 . . . Mn in a coordinated manner to read data stored by the memory cells M1 . . . Mn. In one approach, any one of the signal SW2 having a low voltage (e.g., GND) applied to the switching circuit 240 or the word line control signal WL having a low voltage (e.g., GND) applied to the split gate electrode SG of the memory cell M may prevent current Iout to flow from the capacitor C through the bit line BL. In one approach, the signal SW2 having a high voltage (e.g., VDD) and the word line control signal WL having a high voltage (e.g., VDD) may allow current Iout to flow from the capacitor C through the bit line BL. The current sensor 220 may sense a voltage at the capacitor C in response to the current Iout through the bit line BL to determine data stored by the memory cells M1 . . . Mn. In one aspect, the signals SW1, SW2, and word line control signals (or various pulses) can be applied to the switching circuit 240 and the set of memory cells M1 . . . Mn in a coordinate manner, such that high speed read operations (e.g., over 1 Gbps) can be performed in a reliable manner, as described below with respect to FIG. 4.

Figure 4:
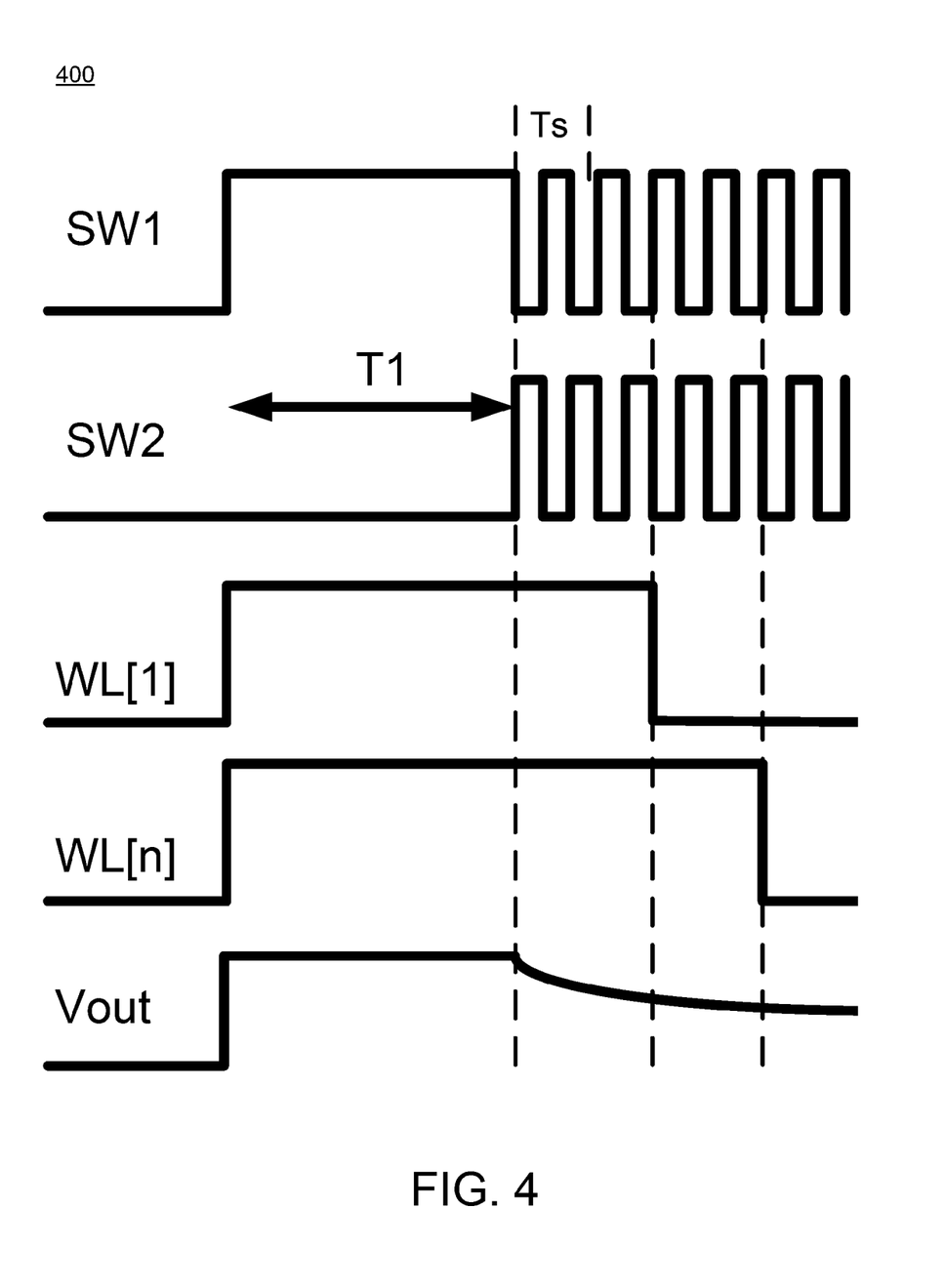
FIG. 4 is a timing diagram showing an operation of the memory system of FIG. 1, in accordance with one embodiment.

FIG. 4 is a timing diagram 400 showing an operation of the memory system 100 of FIG. 1, in accordance with one embodiment. In one aspect, the timing controller 110 generates signals SW1, SW2 including pulses, and applies the signals SW1, SW2 to the gate electrodes of the transistors I2, I3. The timing controller 110 may configure or cause the gate line controller 114 to generate word line control signals WL[1] . . . WL[n], and apply the word line control signals WL[1] . . . WL[n] to split gate electrodes of the memory cells M1 . . . Mn. In one example, a word line control signal WL[1] having a high voltage (e.g., VDD) may enable the memory cell M1 to conduct current according to data stored by the memory cell M1. In one aspect, the word line control signal WL[1] having a low voltage (e.g., GND) may disable the memory cell M1 from conducting current.

In some embodiments, the timing controller 110 generates the signal SW1 having a low voltage (e.g., GND) and the signal SW2 having a high voltage (e.g., VDD) for a set time period T1, from a time at which rising edges of the word line control signals WL[1] . . . WL[n] occur. In one aspect, the word line control signals WL[1] . . . WL[n] have pulses at a high frequency (e.g., over 1 GHz or higher). Such high frequency pulses may be coupled to or propagate to other gate lines of the memory cells through parasitic capacitances. The set time period T1 may be larger than a time period (e.g., 2-3 ns) for voltages or current at the gate lines to settle after parasitic coupling. By applying the signal SW1 having a high voltage (e.g., VDD) and the signal SW2 having a low voltage (e.g., GND) to the switching circuit 240 for the set time period T1, the switching circuit 240 may provide the reference voltage Vref to the bit line BL and disable current Iout from flowing through the bit line BL until the voltages or current at the gate lines settle after the parasitic couplings.

After the set time period T1, the timing controller 110 may generate the signals SW1, SW2 having pulses to read data stored by the memory cells M1 . . . Mn. The pulses of the SW1, SW2 may have a sampling period Ts with opposite phases. In one aspect, by applying the signal SW1 having a low voltage (e.g., GND) and the signal SW2 having a high voltage (e.g., VDD) to the switching circuit 240, the switching circuit 240 may not provide the reference voltage Vref to the bit line BL and enable current Iout corresponding to data stored by the memory cells M1 . . . Mn to flow through the bit line BL. For example, a voltage Vout at the capacitor C of the current sensor 220 may decrease after the set time period T1 according to the current Iout through the bit line BL and the switching circuit 240. The sense amplifier of the current sensor 220 may sense the decreased voltage at the capacitor C, and determine data stored by the memory cells M1 . . . Mn, according to the amount of decrease in the voltage at the capacitor C. By sensing current after the set time period T1, data stored by the memory cells M1 . . . Mn can be sensed or read in an accurate manner despite parasitic couplings.

In one aspect, a falling edge of the signal WL applied to the split gate electrode SG of the memory cell M through the word line is aligned with a rising edge of the signal SW1 and a falling edge of the signal SW2 applied to the switching circuit 240. In one aspect, in response to the falling edge of the signal WL, the memory cell M may be disabled from conducting current. By aligning the falling edge of the signal WL with the rising edge of the signal SW1 and the falling edge of the signal SW2 applied to the switching circuit 240, the switching circuit 240 may electrically couple the voltage source 210 to the bit line BL and electrically decouple the current sensor 220 from the bit line BL when the memory cell M is disabled, such that a fluctuation or variation in a voltage at the bit line BL, for example, due to the falling edge of the signal WL through parasitic capacitances can be reduced.

Figure 5:
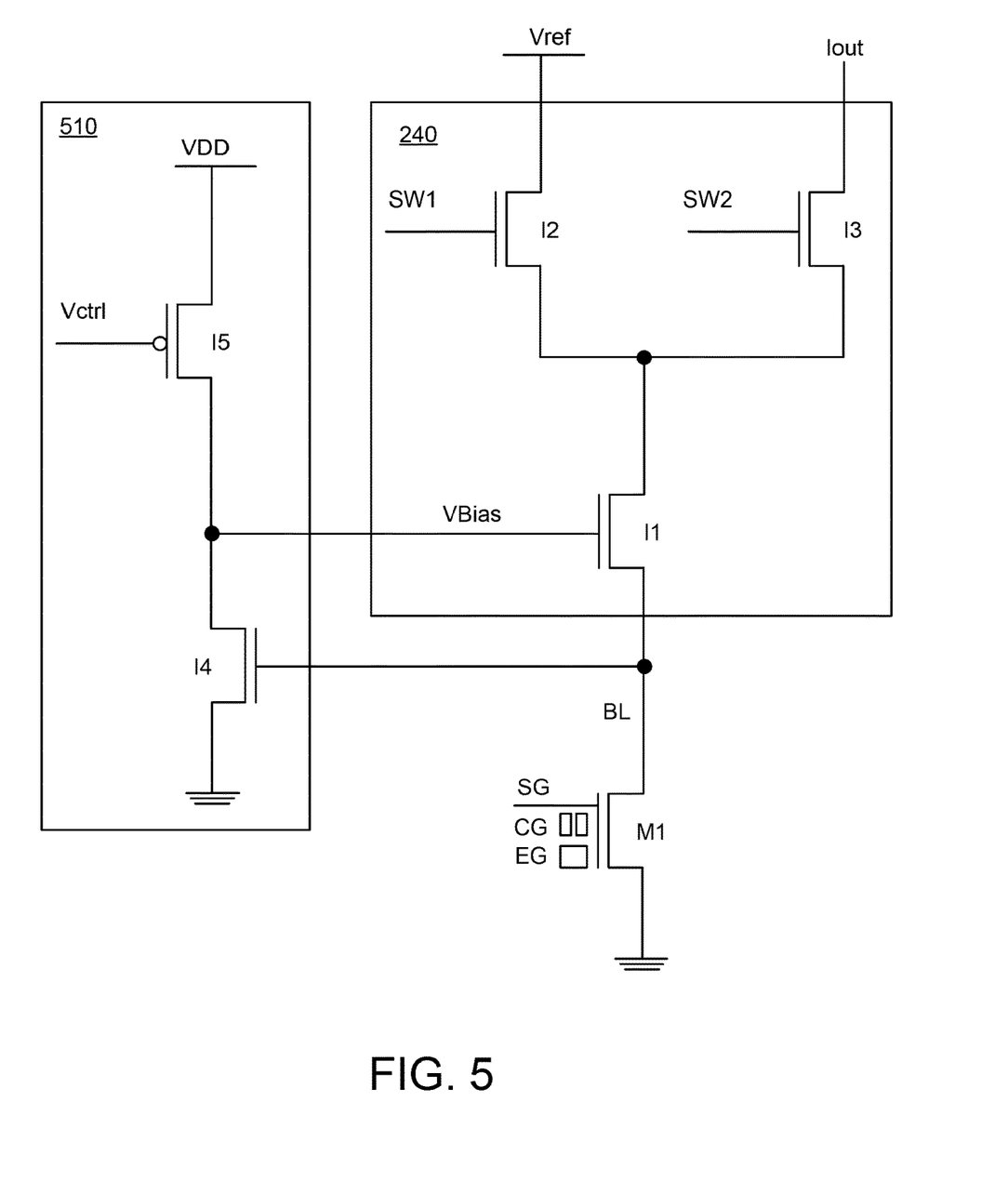
FIG. 5 is a diagram of a switching circuit and a feedback circuit connected to the switching circuit, in accordance with one embodiment.

FIG. 5 is a diagram of the switching circuit 240 and a feedback circuit 510 connected to the switching circuit 240, in accordance with one embodiment. In one aspect, the feedback circuit 510 is part of the bias controller 230. In some embodiments, the feedback circuit 510 includes an input port connected to the bit line BL (or a source electrode of the transistor I1 of the switching circuit 240) and an output port coupled to a gate electrode of the transistor I1. In this configuration, the feedback circuit 510 may sense a voltage at the bit line BL, and generate a bias voltage VBias according to the sensed voltage to regulate or control voltage at the bit line BL.

In some embodiments, the feedback circuit 510 includes a transistor I4 and a transistor I5. The transistors I4, I5 may be MOSFETs, FinFETs, GAAFETs or any transistors. The transistor I4 may be a N-type transistor and the transistor I5 may be a P-type transistor. In one configuration, a source electrode of the transistor I4 is connected to a power rail, at which a ground voltage (e.g., GND) is provided. In one configuration, a gate electrode of the transistor I4 is connected to the bit line BL. In one configuration, a drain electrode of the transistor I4 is connected to a drain electrode of the transistor I5 and a gate electrode of the transistor I1. In one configuration, a gate electrode of the transistor I5 receives a voltage control signal Vctrl. In one configuration, a source electrode of the transistor I5 is connected to a power rail, at which a supply voltage (e.g., VDD) is provided. In this configuration, the transistor I4 may sense a voltage at the bit line BL, and generate a bias voltage VBias at the drain electrode of the transistor I4, according to the sensed voltage. For example, in response to a decrease in the voltage at the bit line BL, the transistor I4 may increase the bias voltage VBias, thereby causing the voltage at the bit line BL to increase. For example, in response to an increase in the voltage at the bit line BL, the transistor I4 may decrease the bias voltage VBias, thereby causing the voltage at the bit line BL to decrease.

In one aspect, the control voltage Vctrl can set a current (e.g., DC current) through the transistors I4, I5. According to the current through the transistors I4 and I5 according to the control voltage Vctrl, the bias voltage VBias can be set. In one aspect, the current through the transistors I4, I5 can set a transconductance (gm) or an amount of responsiveness of the transistor I4 to the voltage at the bit line BL. Hence, the feedback circuit 510 can be adaptively adjusted or configured according to the control voltage Vctrl.

Figure 6:
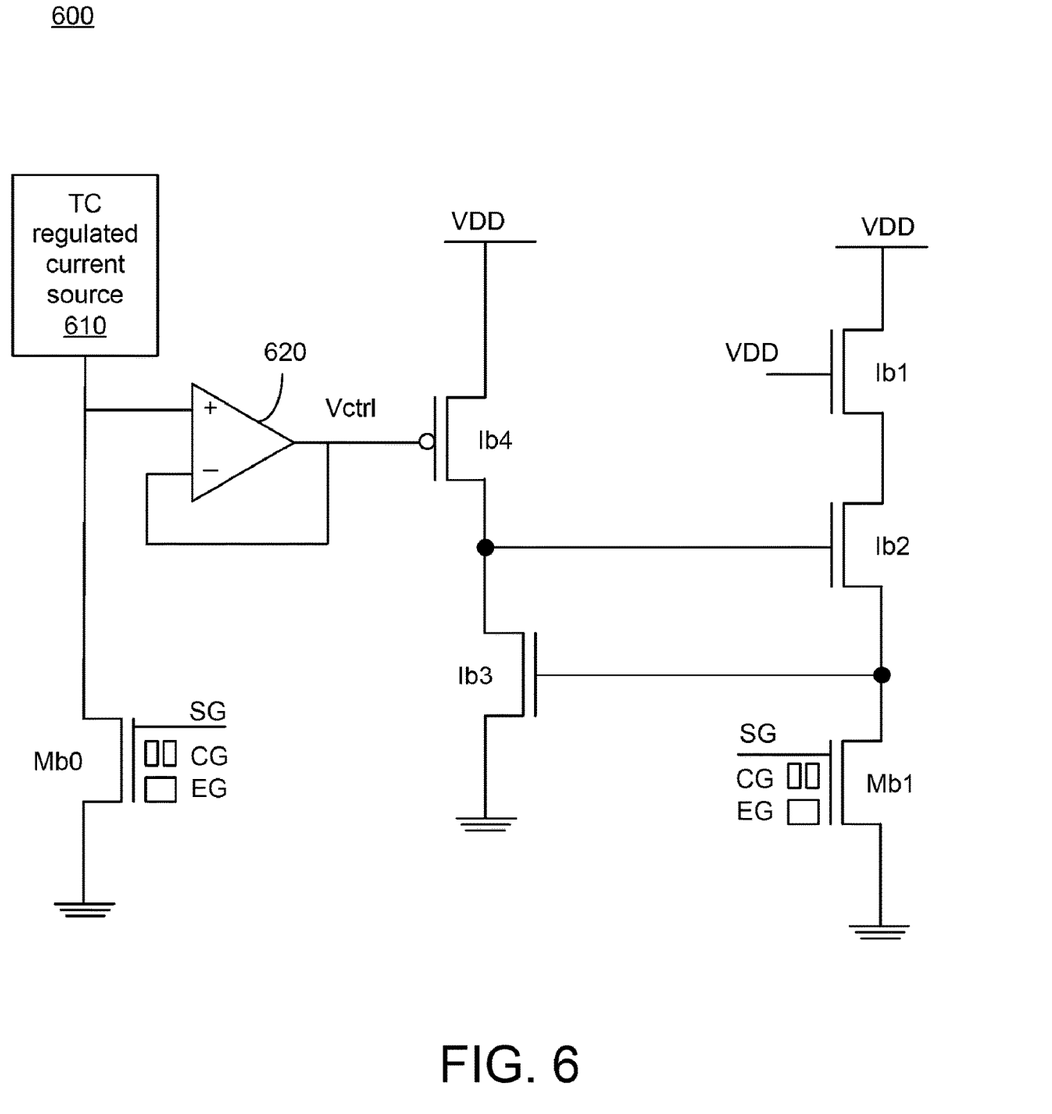
FIG. 6 is a diagram of a bias circuit to control the feedback circuit of FIG. 5, in accordance with one embodiment.

FIG. 6 is a diagram of a bias circuit 600 to control the feedback circuit 510 of FIG. 5, in accordance with one embodiment. In some embodiments, the bias circuit 600 includes transistors Ib1, Ib2, Ib3, Ib4, memory cells Mb0, Mb1, an amplifier 620, and temperature control (TC) regulated current source 610. The transistors Ib1, Ib2, Ib3, Ib4 may be MOSFETs, FinFETs, GAAFETs or any transistors. The transistors Ib1, Ib2, Ib3 may be N-type transistors and the transistor Ib4 may be a P-type transistor. The temperature coefficient regulated current source 610 may be a bandgap circuit or any circuit that provides a controlled or regulated current over a temperature range (e.g., −40 C.° to 150 C.°). The memory cells Mb0, Mb1 may be same type of memory cells (e.g., flash memory cells) as the memory cells M1 . . . Mn. These components may operate together to generate the control voltage Vctrl and provide the control voltage Vctrl to the feedback circuit 510.

In one configuration, the TC regulated current source 610 is connected to a first input port (e.g., "+" input port) of the amplifier 620, and the memory cell Mb0. In one configuration, a second input port (e.g., "−" input port) of the amplifier 620 is connected to a gate electrode of the transistor Ib3 to form a negative feedback configuration to generate the control signal Vctrl at the output port. In one configuration, the output port of the amplifier 620 is connected to a gate electrode of the transistor Ib4. The amplifier 620 may compare a voltage at the first input port and a voltage at the second input port, and generate or adjust the control voltage Vctrl at the output port to reduce the difference between a voltage at the first input port and a voltage at the second input port. In one aspect, the transistors Ib4, Ib3, Ib1, Ib2 and the memory cell Mb1 can emulate or mimic the transistors I4, I3, I1, I2 (or I3) and the memory cell M. By implementing the transistors Ib4, Ib3, Ib1, Ib2 and the memory cell Mb1 having the similar configuration as the transistors I4, I3, I1, I2 (or I3) and the memory cell M, the amplifier 620 may generate the control voltage Vctrl for controlling current through the transistors I4, I5 of the feedback circuit 510 despite temperature variations.

Figure 7:
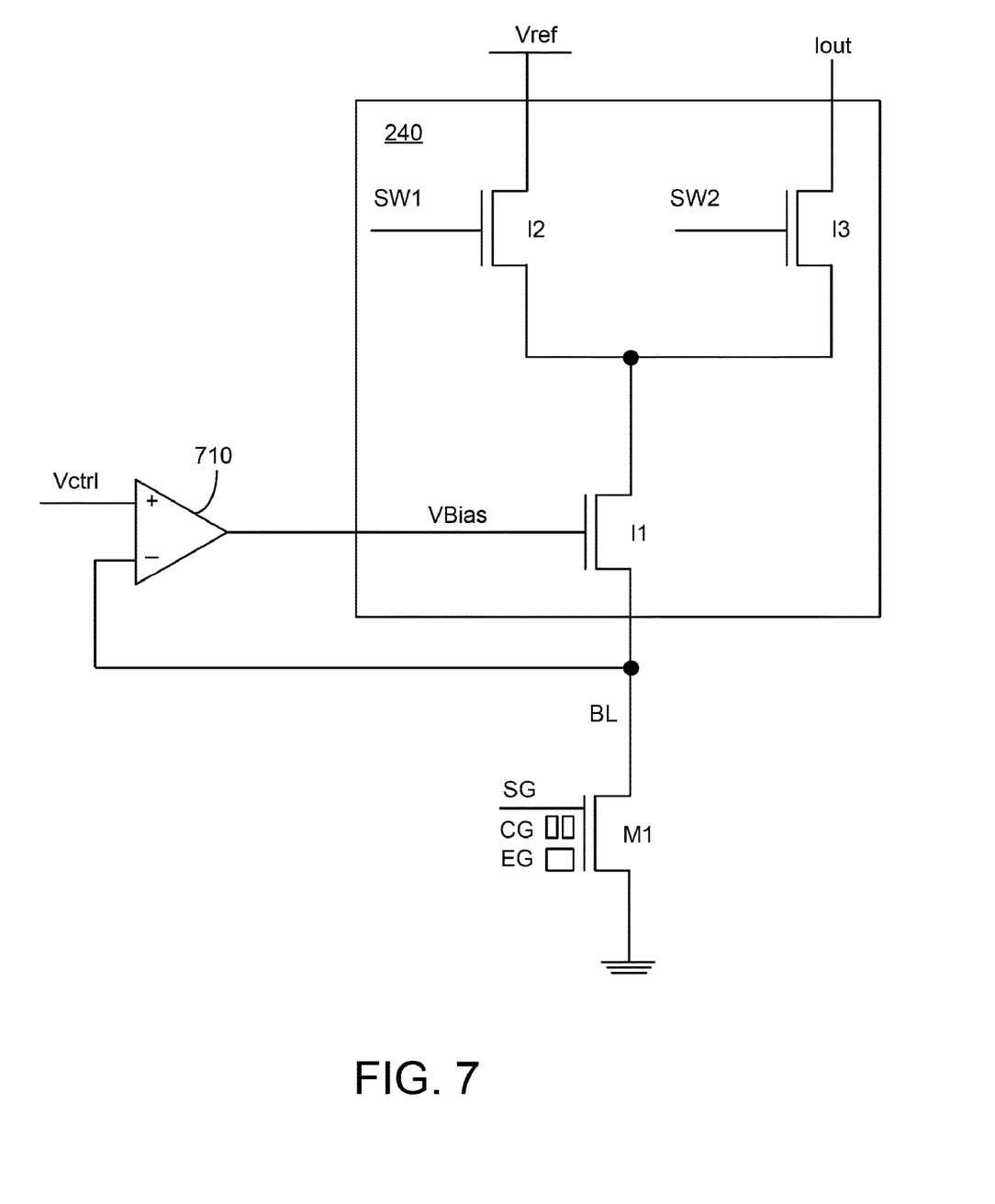
FIG. 7 is a diagram of a switching circuit and a feedback circuit connected to the switching circuit, in accordance with one embodiment.

FIG. 7 is a diagram of the switching circuit 240 and a feedback circuit 710 connected to the switching circuit 240, in accordance with one embodiment. In one aspect, the feedback circuit 710 is part of the bias controller 230. In some embodiments, the feedback circuit 710 may be implemented instead of the feedback circuit 510. The feedback circuit 710 may be embodied as an amplifier (e.g., operational amplifier). In one configuration, the feedback circuit 710 includes a first input port to receive the control voltage Vctrl, a second input port connected to the bit line BL, and an output port coupled to the gate electrode of the transistor I1. In this configuration, the feedback circuit 710 may compare the control voltage Vctrl at the first input port and the voltage at the bit line BL, and generate or adjust the bias voltage VBias at the output port to reduce the difference between the control voltage Vctrl and the voltage at the bit line BL. In one aspect, the feedback circuit 710 or operational amplifier implemented as shown in FIG. 7 can increase a loop gain of the feedback formed by the feedback circuit 710 and the transistor I1 to reduce variations or fluctuations at the bit line BL.

Figure 8:
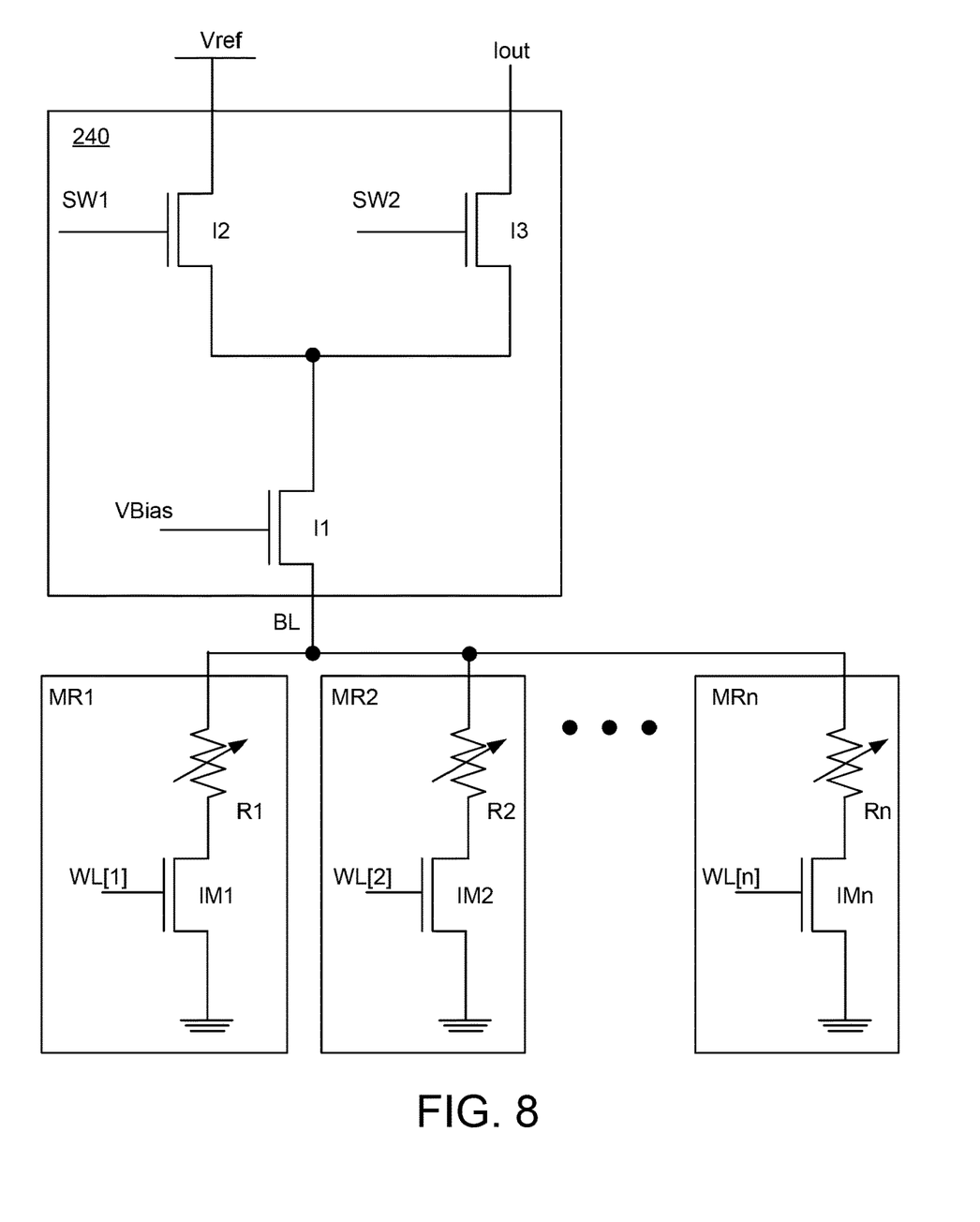
FIG. 8 is a diagram of a switching circuit and a set of resistive memory cells connected to the switching circuit, in accordance with one embodiment.

FIG. 8 is a diagram of the switching circuit 240 and a set of resistive memory cells MR1, MR2 . . . MRn connected to the switching circuit 240, in accordance with one embodiment. In some embodiments, the set of memory cells MR1, MR2 . . . MRn may be implemented as the memory cells 125 of FIG. 1. Each memory cell MR may include a resistive memory device (e.g., RRAM, PCRAM, MRAM device), and a transistor IM. In one aspect, a transistor IM may be connected to a corresponding resistive memory device in series, and enable current to flow through the resistive memory device according to a word line control signal provided through a word line. By enabling or disabling a current through the resistive memory device, the resistive memory device may store data. In one aspect, the switching circuit 240 may selectively apply the reference voltage Vref to the bit line BL or enable the current Iout to flow through memory cells MR1 . . . MRn, as described above with respect to FIG. 2 through 7.

Figure 9:
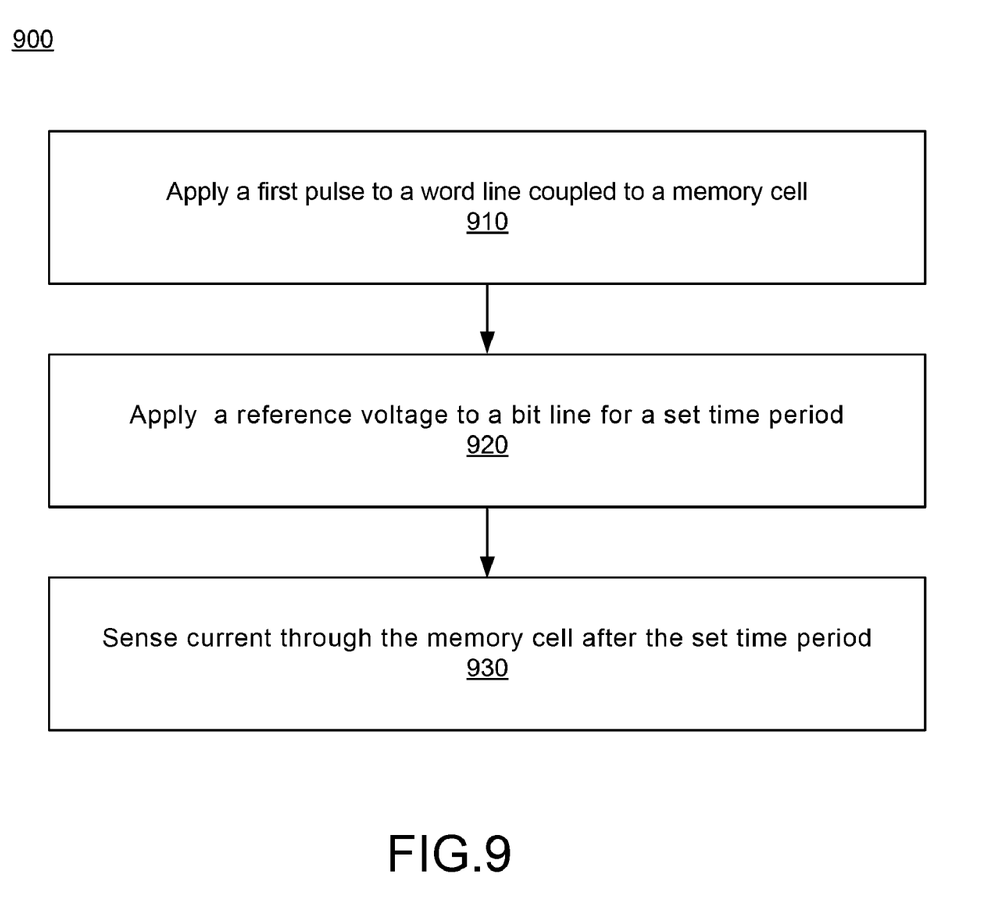
FIG. 9 is a flowchart showing a method of configuring a memory cell, in accordance with some embodiments.

FIG. 9 is a flowchart showing a method 900 of reading data stored by the memory cell 125 by configuring the switching circuit 240, in accordance with some embodiments. The method 900 may be performed by the memory controller 105 of FIG. 1. In some embodiments, the method 900 is performed by other entities. In some embodiments, the method 900 includes more, fewer, or different operations than shown in FIG. 9.

In an operation 910, the memory controller 105 applies a first pulse to a word line coupled to the memory cell M. The first pulse may be a pulse of a word line control signal. The memory cell M may be a flash memory cell, a resistive memory cell, or any memory cell for storing data. In one approach, the timing controller 110 configures or causes the gate line controller 114 to apply the first pulse to the word line. In one approach, the timing controller 110 generates the signal SW1 having a low voltage (e.g., GND) and the signal SW2 having a high voltage (e.g., VDD) for a set time period T1, from a time at which a rising edge of the word line control signal occurs.

In an operation 920, the memory controller 105 applies a reference voltage Vref to the bit line BL for a set time period T1. In one aspect, the timing controller 110 applies a signal SW1 having a high voltage (e.g., VDD) to the transistor I2 of the switching circuit 240 and a signal SW2 having a low voltage (e.g., GND) to the transistor I3 of the switching circuit 240. In response to the signal SW1 having the high voltage and the signal SW2 having the low voltage, the transistor I2 may be enabled and the transistor I3 may be disabled to electrically couple the voltage source 210 to the bit line BL and electrically decouple the current sensor 220 from the bit line BL. In one aspect, the first pulse applied to a word line may affect voltages or current at other gate lines of the memory cell through parasitic coupling. The set time period T1 may be larger than a time period (e.g., 2-3 ns) for voltages or current at the gate lines to settle after parasitic coupling between the gate lines and the word line. By applying the reference voltage Vref to the bit line BL during the set time period, the voltage at the bit line can be maintained or controlled reliably despite the parasitic couplings.

In an operation 930, the memory controller 105 senses the current Iout through the memory cells after the set time period T1. In one approach, the timing controller 110 applies the signal SW1 having a low voltage (e.g., GND) and the signal SW2 having a high voltage (e.g., VDD) to the switching circuit 240 after the set time period T1. In response to the signal SW1 having the low voltage and the signal SW2 having the high voltage, the transistor I2 may be disabled and the transistor I3 may be enabled to electrically decouple the voltage source 210 from the bit line BL and electrically couple the current sensor 220 to the bit line BL. When the current sensor 220 is electrically coupled to the bit line BL, the current sensor 220 may sense the current Iout through the bit line BL and the memory cell M. By sensing the current Iout after the set time period T1, inaccuracy in reading data due to parasitic coupling from the first pulse can be reduced or obviated.

In one approach, the timing controller 110 applies a signal SW1 having a set of second pulses to the transistor I2 of the switching circuit 240 and a signal SW2 having a set of third pulses to the transistor I3 of the switching circuit 240. The set of second pulses and the set of third pulses may have a sampling period Ts with opposite phases. In one example, the capacitor C of the current sensor 220 may discharge according to the current Iout through the bit line BL and the sampling period Ts. The sense amplifier of the current sensor 220 may sense the decreased voltage at the capacitor C, and determine data stored by the memory cells, according to the amount of decrease in the voltage at the capacitor C.

In one aspect, a falling edge of the signal WL applied to the split gate electrode SG of the memory cell M through the word line is aligned with a rising edge of the signal SW1 and a falling edge of the signal SW2 applied to the switching circuit 240. In one aspect, in response to the falling edge of the signal WL, the memory cell M may be disabled from conducting current. By aligning the falling edge of the signal WL with the rising edge of the signal SW1 and the falling edge of the signal SW2 applied to the switching circuit 240, the switching circuit 240 may electrically couple the voltage source 210 to the bit line BL and electrically decouple the current sensor 220 from the bit line BL when the memory cell M is disabled, such that a fluctuation or variation in a voltage at the bit line BL, for example, due to the falling edge of the signal WL through parasitic capacitances can be reduced.

Figure 10:
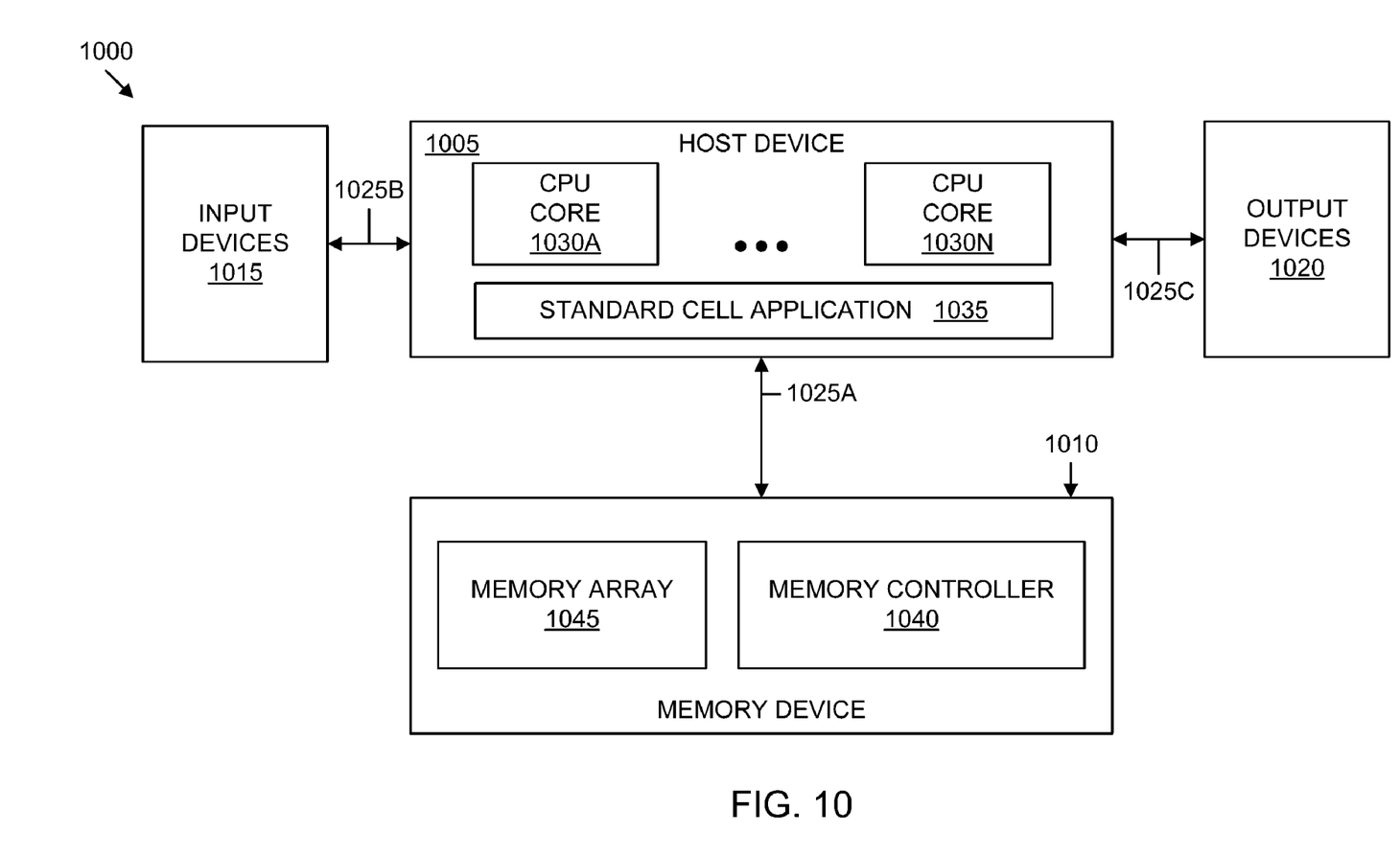
FIG. 10 is an example block diagram of a computing system, in accordance with some embodiments.

Referring now to FIG. 10, an example block diagram of a computing system 1000 is shown, in accordance with some embodiments of the disclosure. The computing system 1000 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1000 includes a host device 1005 associated with a memory device 1010. The host device 1005 may be configured to receive input from one or more input devices 1015 and provide output to one or more output devices 1020. The host device 1005 may be configured to communicate with the memory device 1010, the input devices 1015, and the output devices 1020 via appropriate interfaces 1025A, 1025B, and 1025C, respectively. The computing system 1000 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1005.

The input devices 1015 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1005 and that allows an external source, such as a user (e.g., a circuit or layout designer), to enter information (e.g., data) into the host device and send instructions to the host device. Similarly, the output devices 1020 may include a variety of output technologies such as external memories, printers, speakers, displays, microphones, light emitting diodes, headphones, video devices, and any other output peripherals that are configured to receive information (e.g., data) from the host device 1005. The "data" that is either input into the host device 1005 and/or output from the host device may include any of a variety of textual data, circuit data, signal data, semiconductor device data, graphical data, combinations thereof, or other types of analog and/or digital data that is suitable for processing using the computing system 1000.

The host device 1005 includes or is associated with one or more processing units/processors, such as Central Processing Unit ("CPU") cores 1030A-1030N. The CPU cores 1030A-1030N may be implemented as an Application Specific Integrated Circuit ("ASIC"), Field Programmable Gate Array ("FPGA"), or any other type of processing unit. Each of the CPU cores 1030A-1030N may be configured to execute instructions for running one or more applications of the host device 1005. In some embodiments, the instructions and data to run the one or more applications may be stored within the memory device 1010. The host device 1005 may also be configured to store the results of running the one or more applications within the memory device 1010. Thus, the host device 1005 may be configured to request the memory device 1010 to perform a variety of operations. For example, the host device 1005 may request the memory device 1010 to read data, write data, update or delete data, and/or perform management or other operations. One such application that the host device 1005 may be configured to run may be a standard cell application 1035. The standard cell application 1035 may be part of a computer aided design or electronic design automation software suite that may be used by a user of the host device 1005 to use, create, or modify a standard cell of a circuit. In some embodiments, the instructions to execute or run the standard cell application 1035 may be stored within the memory device 1010. The standard cell application 1035 may be executed by one or more of the CPU cores 1030A-1030N using the instructions associated with the standard cell application from the memory device 1010. In one example, the standard cell application 1035 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 10, the memory device 1010 includes a memory controller 1040 that is configured to read data from or write data to a memory array 1045. The memory array 1045 may include a variety of volatile and/or non-volatile memories. For example, in some embodiments, the memory array 1045 may include NAND flash memory cores. In other embodiments, the memory array 1045 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1045 may be individually and independently controlled by the memory controller 1040. In other words, the memory controller 1040 may be configured to communicate with each memory within the memory array 1045 individually and independently. By communicating with the memory array 1045, the memory controller 1040 may be configured to read data from or write data to the memory array in response to instructions received from the host device 1005. Although shown as being part of the memory device 1010, in some embodiments, the memory controller 1040 may be part of the host device 1005 or part of another component of the computing system 1000 and associated with the memory device. The memory controller 1040 may be implemented as a logic circuit in either software, hardware, firmware, or combination thereof to perform the functions described herein. For example, in some embodiments, the memory controller 1040 may be configured to retrieve the instructions associated with the standard cell application 1035 stored in the memory array 1045 of the memory device 1010 upon receiving a request from the host device 1005.

It is to be understood that only some components of the computing system 1000 are shown and described in FIG. 10. However, the computing system 1000 may include other components such as various batteries and power sources, networking interfaces, routers, switches, external memory systems, controllers, etc. Generally speaking, the computing system 1000 may include any of a variety of hardware, software, and/or firmware components that are needed or considered desirable in performing the functions described herein. Similarly, the host device 1005, the input devices 1015, the output devices 1020, and the memory device 1010 including the memory controller 1040 and the memory array 1045 may include other hardware, software, and/or firmware components that are considered necessary or desirable in performing the functions described herein.

One aspect of this description relates to a memory system. In some embodiments, the memory system includes a memory cell and a bit line connected to the memory cell. In some embodiments, the memory system includes a pair of transistors to electrically couple, to the bit line, a selected one of i) a voltage source to bias the memory cell or ii) a sensor to sense a current through the memory cell. In some embodiments, the memory system includes a first transistor, where the first transistor and the bit line are connected between the pair of transistors and the memory cell in series.

One aspect of this description relates to a method of operating a memory system. In one aspect, the method includes applying, by a memory controller, a first pulse to a memory cell. The first pulse has a first edge at a first time and a second edge subsequent to the first edge at a second time after the first time. In one aspect, the method includes applying, by the memory controller in response to the first edge of the first pulse, a first voltage to a first transistor during a first duration to electrically couple a voltage source to a bit line. The first transistor may be connected to the memory cell through the bit line of the memory cell. In one aspect, the first duration is between the first time and the second time. In one aspect, the method includes applying, by the memory controller in response to the first edge of the first pulse, a second voltage to a second transistor during the first duration to electrically decouple a sensor from the bit line. A source electrode of the first transistor and a source electrode of the second transistor may be connected to the memory cell through the bit line of the memory cell. In one aspect, the method includes applying the second voltage to the first transistor during a second duration after the first duration to electrically decouple the voltage source from the bit line. The second duration may be between the first time and the second time. In one aspect, the method includes applying the first voltage to the second transistor during the second duration to electrically couple the sensor to the bit line.

One aspect of this description relates to a memory system. In some embodiments, the memory system includes a set of memory cells and a bit line connected to the set of memory cells. In some embodiments, the memory system includes a first transistor connected between a voltage source and the bit line and a second transistor connected between a sensor and the bit line.

In one aspect, the memory system includes a memory controller connected to the memory cell, the first transistor, and the second transistor. In one aspect, the memory controller is to enable the first transistor while disabling the second transistor to bias the memory cell according to the voltage source, and disable the first transistor while enabling the second transistor to sense a current through the memory cell by the sensor. In one aspect, the memory controller is to apply a first pulse to the memory cell. The first pulse has a first edge at a first time and a second edge subsequent to the first edge at a second time after the first time. In one aspect, the memory controller is to apply, in response to the first edge of the first pulse, a first voltage to the first transistor during a first duration to electrically couple the voltage source to the bit line. The first duration is between the first time and the second time. In one aspect, the memory controller is to apply, in response to the first edge of the first pulse, a second voltage to the second transistor during the first duration to electrically decouple the sensor from the bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system comprising:
   a plurality of memory cells connected to a bit line;
   a pair of transistors configured to couple, to the bit line,
      a selected one of i) a voltage source or ii) a sensor, wherein the pair of transistors are gated by respective pulse signals; and
   a first transistor including:
   a first source/drain electrode connected to each of the pair of transistors; and
   a second source/drain electrode connected to the bit line.

2. The memory system of claim 1, wherein the pair of transistors comprise a second transistor and a third transistor; a first source/drain electrode of the second transistor is coupled to the voltage source; and a first source/drain electrode of the third transistor is coupled to the sensor.

3. The memory system of claim 2, wherein respective second source/drain electrodes of each of the second transistor and the third transistor are coupled to the bit line.

4. The memory system of claim 1, further comprising a memory controller coupled to the pair of transistors and configured to generate the respective pulse signals.

5. The memory system of claim 4, wherein the memory controller is further configured to:
   enable a second transistor of the pair of transistors while disabling a third transistor of the pair of transistors to bias the plurality of memory cells through the bit line according to the voltage source, and disable the second transistor while enabling the third transistor to sense a current through the plurality of memory cells by the sensor.

6. The memory system of claim 4, wherein the memory controller is further configured to:
apply a first pulse having a first edge at a first time and a second edge subsequent to the first edge at a second time,
apply, in response to the first edge of the first pulse, a first voltage to a second transistor of the pair of transistors during a first duration to electrically couple the voltage source to the bit line, wherein the first duration is between the first time and the second time, and
apply, in response to the first edge of the first pulse, a second voltage to a third transistor of the pair of transistors during the first duration to electrically decouple the sensor from the bit line.

7. The memory system of claim 6, wherein the first edge of the first pulse is aligned with a rising edge of a second pulse applied to the second transistor of the pair of transistors.

8. The memory system of claim 1, further comprising a feedback circuit including an input connected to the second source/drain electrode of the first transistor and an output connected to a gate electrode of the first transistor.

9. The memory system of claim 8, wherein the feedback circuit comprises an operational amplifier.

10. The memory system of claim 8, comprising a bias circuit configured to adjust a voltage at the bit line by adjusting a bias voltage at the gate electrode of the first transistor.

11. The memory system of claim 1, wherein the plurality of memory cells comprises a flash memory cell.

12. A method, comprising:
applying, by a memory controller, a first pulse to a memory cell;
applying, by the memory controller, in response to a first edge of the first pulse, a voltage source to a bit line of the memory cell, the voltage source applied for a first duration; and
sensing, by the memory controller via a sensor, current through the memory cell during a second duration after the first duration.

13. The method of claim 12, wherein applying the voltage source to the bit line comprises:
applying, by the memory controller, a first voltage to a first transistor to apply the voltage source to the bit line, a first source/drain electrode of the first transistor coupled to the voltage source and a source/drain electrode of the first transistor coupled to the bit line.

14. The method of claim 13, further comprising:
applying, by the memory controller in response to the first edge of the first pulse, a second voltage to a second transistor during the first duration, the second voltage causing the second transistor to electrically decouple the sensor from the bit line during the first duration.

15. The method of claim 13, further comprising:
applying a second voltage to the first transistor during the second duration to electrically decouple the voltage source from the bit line, and
applying the first voltage to a second transistor during the second duration to electrically couple the sensor to the bit line.

16. The method of claim 12, wherein the first edge of the first pulse is aligned with arising edge of a second pulse applied to a first transistor electrically coupled to the voltage source.

17. The method of claim 12, wherein the memory cell is a flash memory cell.

18. A memory system, comprising:
a set of memory cells connected to a common bit line;
a first transistor connected to a voltage source;
a second transistor connected to a sensor, a source electrode of the first transistor and a source electrode of the second transistor coupled to a node; and
a memory controller configured to control the first transistor and the second transistor to provide the voltage source to the common bit line and electrically decouple the sensor from the common bit line, the voltage source applied for a first duration in response to a first edge of a first pulse.

19. The memory system of claim 18, further comprising:
a third transistor having a first source/drain electrode coupled to the node and a second source/drain electrode coupled to the common bit line.

20. The memory system of claim 18, wherein the memory controller is further configured to:
apply the first pulse having the first edge at a first time and a second edge subsequent to the first edge at a second time.

* * * * *